United States Patent [19]
Van Der Wal et al.

[11] Patent Number: 5,578,959
[45] Date of Patent: Nov. 26, 1996

[54] INTEGRATED CIRCUIT WITH AN ELECTRICALLY ADJUSTABLE PARAMETER

[75] Inventors: Robbert H. Van Der Wal; Laurens J. De Haas, both of Eindhoven, Netherlands

[73] Assignee: U.S. Philips Corporation, New York, N.Y.

[21] Appl. No.: 167,278

[22] Filed: Dec. 14, 1993

[30] Foreign Application Priority Data

Dec. 15, 1992 [EP] European Pat. Off. ............. 92203925

[51] Int. Cl.⁶ .................................. G06F 7/44; G06G 7/16
[52] U.S. Cl. ............................................. 327/356; 327/334
[58] Field of Search ........................... 333/214; 327/355, 327/356, 360, 596, 334

[56] References Cited

U.S. PATENT DOCUMENTS

| | | | |
|---|---|---|---|
| 3,571,763 | 3/1971 | Haase | 333/24 |
| 4,025,867 | 5/1977 | Seidel | 333/214 |
| 4,109,214 | 8/1978 | Main | 330/245 |
| 4,602,224 | 7/1986 | Arimoto et al. | 333/214 |
| 4,638,265 | 1/1987 | Lunn et al. | 333/214 |

FOREIGN PATENT DOCUMENTS

| | | | |
|---|---|---|---|
| 0225332 | 6/1987 | European Pat. Off. | H03H 11/46 |
| 0003515 | 1/1987 | Japan | 333/214 |

*Primary Examiner*—Toan Tran
*Attorney, Agent, or Firm*—Laurie E. Gatham

[57] ABSTRACT

In an integrated circuit an effective admittance is adjusted. The adjustment uses an admittance element in combination with a current multiplier circuit. The current multiplier circuit provides current $I_p$ proportional to a reference current $I_{ref}$ through the admittance element: $I_p = \alpha I_{ref}$. The current $I_p$ flows through a terminal in parallel with the current $I_{ref}$ through the admittance element. This reduces the effective admittance to ground seen at the terminal. The proportionality coefficient $\alpha$ is modulated using a control circuit which sets the coefficient $\alpha$ in a non-linear dependence $(a+bM)/(c+dM)$, or $P(M)/Q(M)$, where $P$ and $Q$ are polynomials, on a control signal $M$. In this way various electronic parameters which depend non-linearly on the effective admittance can be given a linear dependence on the control signal.

16 Claims, 7 Drawing Sheets

5,578,959

1

INTEGRATED CIRCUIT WITH AN ELECTRICALLY ADJUSTABLE PARAMETER

FIELD OF THE INVENTION

The invention relates to an integrated circuit comprising adjusting means for adjusting at least one electronic parameter of the integrated circuit, the adjusting means being arranged for adjusting an effective admittance value of an effective admittance circuit comprising an admittance element, a parallel circuit, coupled in parallel to the admittance element, and arranged for conducting a parallel current $I_p$ in parallel with a current through the admittance element, the adjusting means comprising a control circuit, having an output coupled to a control input of the parallel circuit and an input for a control signal M for controlling the conducting by the parallel circuit.

The invention also relates to an electronic circuit containing such an integrated circuit.

BACKGROUND OF THE INVENTION

A circuit with adjustable admittance is known from U.S. Pat. No. 4,109,214. This publication describes the parallel circuit as a differential pair, with a first and second transistor whose emitters are connected to each other and to a DC current source. The admittance element, for example a capacitor, is connected between the collector and the emitter of the first transistor. The first terminal is connected to the collector of the first transistor. The collector of the second transistor is coupled to the second terminal, which for AC purposes may be regarded as circuit ground. In operation the emitter connection will have a low effective impedance to ground; this means that for the purpose of determining the current through the admittance element this element may be regarded as connected between the first and second terminal.

When an alternating voltage is supplied across the terminals a current will develop through the admittance element. A part of this current will be forcibly supplied back to the first terminal via the collector of the first transistor. The remainder of the current flows via the second transistor to the second terminal. This remainder is equal to the net current that is drawn from the first terminal and is smaller than the current through the admittance element.

As a consequence, the effective admittance has an admittance value which can be adjusted by controlling the conduction through the first and second transistor. The effective admittance value can be adjusted between zero admittance (in case the first transistor is made completely conductive and the second transistor is made non-conductive) and the admittance of the admittance element (in case the first transistor is made non conductive and the second transistor is made completely conductive).

The conduction through the first and second transistor (and with it the effective admittance) is controlled by the difference between the voltages on the base connections of the first and second transistor. The effective admittance value depends exponentially upon this difference. The prior art teaches a control circuit which is coupled between the input for the control signal M and the base connection, and which realizes a linear relation between the effective admittance value and the control signal M.

2

However, the adjustment of the effective admittance is often used in order to adjust an electronic parameter of the circuit other than the effective admittance itself. In such a case the linear relation between the effective admittance value and the control signal M does not guarantee a linear relation between the control signal M and the electronic parameter.

SUMMARY OF THE INVENTION

Amongst others, it is an object of the invention to provide an electronic circuit which is not resticted to a linear relation between the control signal M and the effective admittance value.

It is another object of the invention to provide an electronic circuit having a linear relation between the control signal M and the electronic parameter.

It is a further object of the invention to provide for an integrated circuit in which the electronic parameter is the admittance value of a series arrangement of a further, fixed admittance with the effective admittance, and in which this electronic parameter depends linearly on the control signal M.

It is a further object of the invention to provide for an integrated circuit in which the electronic parameter is an impedance value which depends linearly on the control signal M.

It is a further object of the invention to provide for an integrated circuit of a frequency dependent behaviour on the control signal M is the electronic parameter, and in which the frequency dependent behaviour is linear around a nominal frequency.

The integrated circuit according to the invention is characterized, in that the parallel circuit is arranged for making the parallel current $I_p$ proportional to a reference current $I_{ref}$ through the admittance element: $I_p = \alpha I_{ref}$, with a proportionality coefficient $\alpha$, the control circuit being arranged for setting the coefficient $\alpha$ in a non-linear dependence on the control signal M, the dependence being a ratio $f_1/f_2$ of a first and second factor of which the second factor $f_2$ depends substantially polynomially on the control signal. The polynomial dependence may be linear: M ($f_2 = c + dM$), or of higher order. In the linear case, the effective admittance value $Y_{eff}$, which is the ratio between on one hand the current drawn by the admittance element and the parallel circuit in parallel and on the other hand the voltage applied across the admittance element depends as follows on the coefficient $\alpha$:

$$Y_{eff} = Y_{ref} - \alpha Y_{ref}$$

$Y_{ref}$ is the admittance of the admittance element. The first term on the right corresponds to the current drawn by the admittance element, the second term corresponds to the proportional parallel current $I_p$ that is forcibly supplied in parallel to it by the parallel circuit.

As will be explained in the following, the fact that the second factor (the denominator) in the ratio $f_1/f_2$ the depends on control signal M makes it possible to realize a linear relationship between the control signal M and the electronic parameter for various cases. The first factor $f_1$ may also depend substantially linearly on the control signal M: $f_1 = a + bM$. In this case, the restriction that the coefficient $\alpha$ is non-linearly dependent on the control signal M means that a/b is not equal to c/d.

The dependence of the coefficient $\alpha$ on the control signal M may be substituted in the expression for the effective admittance value $Y_{eff}$. This gives in the linear case $$Y_{eff} = Y_{ref} \frac{c - a + (d - b)M}{c + dM}$$

This expression means that the effective admittance value depends on the control signal M as a ratio of two factors which each depend linearly on the control signal M. When b is made equal to d the numerator will be constant. In this case the effective admittance value depends inversely linearly from the control signal M: the effective impedance (which is the inverse of the effective admittance) depends linearly on the control signal M.

When the effective admittance is placed in series with a further, fixed admittance $Y_f$, this will yield a combined admittance $$Y_{tot} = \frac{Y_{eff} Y_f}{Y_{eff} + Y_{ref}}$$

The effective admittance value appears on the right hand side amongst others in the denominator. When the effective admittance value is linearly dependent on the control signal M (as in the prior art) the combined admittance $Y_{tot}$ is therefore not linearly dependent on the control signal M. This non linear dependence can be prevented using the circuit according to the invention. Substitution of the expression for the effective admittance value $Y_{eff}$ into the expression for the combined admittance $Y_{tot}$ gives $$Y_{tot} = Y_f Y_{ref} \frac{c - a + (d - b)M}{cY_f + (c - a)Y_{ref} + (dY_f + (d - b)Y_{ref})}$$

When the integrated circuit is arranged such that $b/d = 1 + Y_f/Y_{ref}$ the denominator will become independent of the control signal M. In this case, the combined admittance $Y_{tot}$ will therefore depend linearly on the control signal M. Note that in this case b>d since both $Y_f$ and $Y_{ref}$ are positive.

In an embodiment of the invention in which the parallel circuit comprises a differential pair of a first and second transistor with their emitters coupled to each other, the admittance element being coupled in parallel to a collector emitter path of the first transistor, the control circuit comprising a first and second semiconductor junction, the control circuit being arranged for controlling currents through the first and second junction in dependence of the control signal M, the control circuit being arranged for providing, between respective bases of the first and second transistor, a voltage corresponding to a sum of voltages occurring in mutually opposite polarity directions across the first and second junction respectively, characterized, in that the control circuit is arranged for making a sum of a first and second current densisty $i_1$, $i_2$ through respectively the first and second junction linearly dependent on the control signal M, the first current density being weighted in said sum by a ratio of emitter areas $A_1$, $A_2$ of respectively the first and second transistor: $i_1 A_1/A_2 + i_2$. As will be explained below, the second factor $f_2$ is determined by the sum of the current densities. This embodiment therefore provides in a bipolar circuit in which the adjustment of the effective admittance occurs by analogue signals. This is very suitable for high frequency use.

In one embodiment of the circuit according to the invention the first and second junction have mutually different junction areas. In this way, the linear dependence of $f_2$ on the control signal M may be set by means relative dimensioning of junction areas. These relative dimensions can be very accurately controlled in modem IC processes. The sum of the current densities may now be set to a linear function of the control signal M by using currents through the junctions which have mutually complementary linear dependence on the control signal M (i.e. whose sum is independent of the control signal M). Such a mutually complementary dependence can be realized in ways which are robust against spread in integrated circuit manufacturing parameters.

In an embodiment of the circuit according to the invention the control circuit comprises current signal forming means, for forming a first and second current signal in dependence on the control signal M, the first and second current signals having a mutual difference which is linearly dependent on the control signal M, the control circuit comprising first and second current multiplying circuits, arranged for multiplying the first and second current signals with mutually unequal multiplication coefficients, and for supplying the multiplied first and second current signal to the first and second junction respectively. In this way one may again use mutually complementary current signals. The control signal M dependence of the sum of the current densities is realized by supplying multiplied currents, whose sum is dependent on the control signal M, to the junctions. The current multiplying circuits may for example be realized using a first and second current mirror. The multiplication coefficients are differentiated by adjusting the relative emitter areas of the transistors in these current mirrors.

An integrated circuit according to the invention, the parallel circuit comprising a differential pair of a first and second transistor with their emitters coupled to each other, the admittance element being coupled in parallel to a collector emitter path of the first transistor, the control circuit comprising a first and second semiconductor junction, the control circuit being arranged for controlling currents through the first and second junction in dependence of the control signal M, the control circuit being arranged for providing between respective bases of the first and second transistor, a voltage corresponding to a sum of voltages occurring in mutually opposite polarity directions across the first and second junction respectively, is characterized, in that the control circuit comprises at least a third and fourth junction, the sum of voltages being a sum of volatage occurring in pairwise mutually opposite polarity directions accross the first and second, and third and fourth junctions respectively.

In this way quadratic or higher order polynomial second factors may be realized. In the case of a resonance circuit for example, in which the resonance frequency depends inversely proprotionally on square root of the capacitance used, this may be used to provide an inversely square relation between the control signal and the capacitance, so that the resonance frequency depends linearly on the control signal.

The circuit with only the collector of first transistor and (AC) ground terminals of the effective admittance is a single ended circuit, because the current between the terminals will not depend on voltage changes at the second terminal (ground for AC purposes).

An embodiment of the circuit according to the invention in which a collector of the first and second transistor are respectively coupled to a first and second terminal, the integrated circuit comprises a further differential pair of a fifth and sixth transistor with their emitters coupled to each other, a collector of the fifth and sixth transistor respectively being coupled to the second and first terminal, a further admittance element coupled in parallel to a collector emitter path of the fifth transistor, the base connections of the first and fifth being connected to each other and the base connections of the second and sixth transistor being connected to each other. In this way the desired control signal M dependence can also be realized for an effective admittance with double ended connections, (the first and second terminals). The current flowing between these terminals is in proportion to a voltage difference across the terminals.

It should be noted that adjustable double ended admittance circuits as such are known from European patent application No 0 225 332. This publication, however, does not address manipulation of the way in which the admittance depends on the control signal M.

An embodiment of the integrated circuit according to the invention is characterized, in that the admittance element is coupled to the emitter of the first transistor via a current mirror, the admittance element being coupled to an input of the current mirror, an output of the current mirror being coupled to the emitter of the first transistor. The range over which the effective admittance value can be adjusted may be extended by a suitable choice of the amplification factor of the current mirror.

A capacitor may be used as admittance element; this results in a adjustable effective capacitance value between the first and second terminal. The circuit may use internal capacitor in the integrated circuit, but it may also provide for connecting an external capacitor to add to any internal capacitance.

An electronic circuit containing the integrated circuit according to the invention contains an oscillator comprising a negative resistance circuit coupled to a tank circuit, the tank circuit comprising an inductor and the effective admittance between the first and second terminal, the admittance element being a capacitance, whereby an oscillating frequency of the oscillator circuit has a dependence on the control signal M, said dependence having zero second order derivative with respect to the control signal M at at least one point within an operative range of the control signal. The inductor will normally be provided as a discrete component connected to, but outside the integrated circuit.

It is desirable that there is an at least approximately linear relation between the control signal M and the frequency. Around a point where first order derivative of the frequency is non zero, the second order derivative is zero, and the higher order derivatives are not excessively large the relation between the control signal M and the frequency will be substantially linear.

As will be explained in the following, a zero second derivative (for an operative value of the control signal M for which the first derivative is not zero) is possible only because there is a suitable non-linear relation between the effective capacitance and the control signal M. By a suitable choice of the parameters of the integrated circuit in combination with the inductance value of the inductor it is possible to provide a zero second derivative of the frequency.

An embodiment of the electronic circuit according to the invention is characterized, in that the inductor is a further admittance element in a further effective admittance, the tank circuit comprising the further effective admittance and further adjusting means, for adjusting an effective inductance of the further effective admittance under control of the control signal M, whereby the effective inductance and the effective admittance have a substantially identical dependence on the control signal M provided respectively by the further adjusting means and the adjusting means. In this way the oscillation frequency f (which is proportional to $(L_{eff}C_{eff})^{-\frac{1}{2}}$, the inverse of the root of the product of the effective inductance $L_{eff}$ and the effective capacitance $C_{eff}$) can be made to have a dependence on the control signal M which does not contain a root, preferably a linear dependence.

BRIEF DESCRIPTION OF THE DRAWINGS

The advantages and construction of the circuit according to the invention will be described using Figures. A brief description of the Figures is as follows.

DETAILED DESCRIPTION OF THE PREFERRED EMBODIMENTS

Admittance Adjustment

Figure 1:
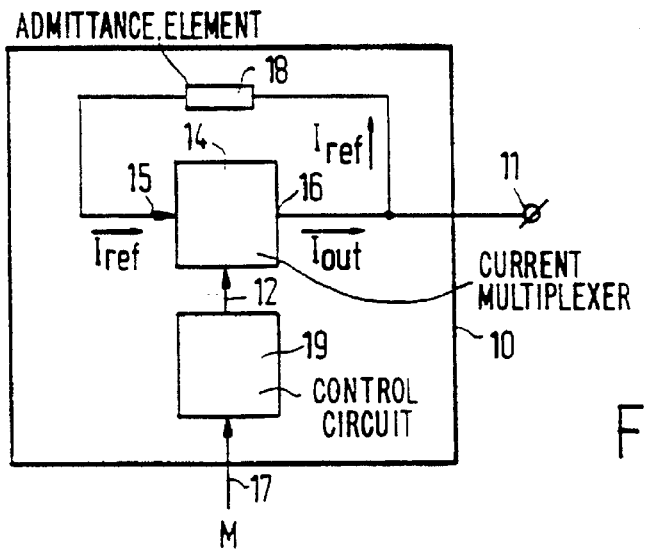
FIG. 1 shows a circuit for presenting an adjustable effective admittance value at an output terminal.

FIG. 1 shows a circuit 10 for adjusting an effective admittance between an output terminal 11 and circuit ground (not shown). The circuit 10 has an input 17 for a control signal M, connected to a control circuit 19. The control circuit 19 has an output connected to a control input 12 of a current multiplying circuit 14. The current multiplying circuit 14 has a current input 15 and a current output 16. The current output 16 is connected to the output terminal 11. The current input 15 and the current output 16 are connected via an admittance element 18, which may for example be a capacitance, a resistor, an inductor or combinations thereof.

In operation, a voltage V (with respect to a common reference level for the circuit, conventionally referred to as ground) is supplied to the output terminal 11. This results in two currents, one, $I_{ref}$, through the admittance element 18, and the other, $I_{out}$, out of the current output 16 of the current multiplying circuit 14. (The sign of the input and output current is defined such that the input current is positive when it flows into input 15 of the current multiplying circuit 14 and the output current is positive when it flows out of the output 16 of the current multiplying circuit. In this way, the current multiplying coefficient α is defined such that it would be 1 if the current multiplying circuit were a direct connection between the current input 15 and output 16).

The current $I_{ref}$ through the admittance element 18 flows into the current input 15 of the current multiplying element 15. The current multiplying circuit 15 provides an output current $I_{out}=\alpha I_{ref}$, which is the product of the input current $I_{ref}$ with a multiplication coefficient $\alpha$. Ideally, the input admittance of the current input 15 is infinite. This means that the current drawn via the admittance element 18 is the product of the admittance value $Y_{ref}$ of the admittance element 18 and the voltage V supplied to the input: $I_{ref}=Y_{ref}V$. Consequently, the total current $I=I_{ref}-I_{out}$ drawn from the output terminal 11 is $I=Y_{ref}V-\alpha Y_{ref}V$. The effective admittance value $Y_{eff}$ at the output terminal (or, more precisely, the admittance between this output and ground) is therefore $$Y_{eff}=Y_{ref}(1-\alpha)$$

The first term on the right corresponds to the current drawn from the output 11 by the admittance element 18; the second term corresponds to the current delivered by the current multiplying circuit 14. In the derivation of this formula, an ideal current multiplying circuit 14 is assumed, that is, it is assumed that the input admittance $Y_{in}$ of the current input 15 is infinite, and that the output admittance $Y_{out}$ of the current output 16 is zero. In practice, this will not be the case. The formula above should then be corrected, replacing $Y_{ref}$ with the series arrangement of $Y_{ref}$ and $Y_{in}$ and replacing $Y_{eff}$ with the parallel arrangement of $Y_{eff}$ and $Y_{out}$. However, in most cases the values of these admittances may be chosen such that this correction can be neglected.

The multiplication coefficient $\alpha$ is controlled by the control signal M via the control circuit 19.

A Bipolar Admittance Adjusting Circuit

Figure 2:
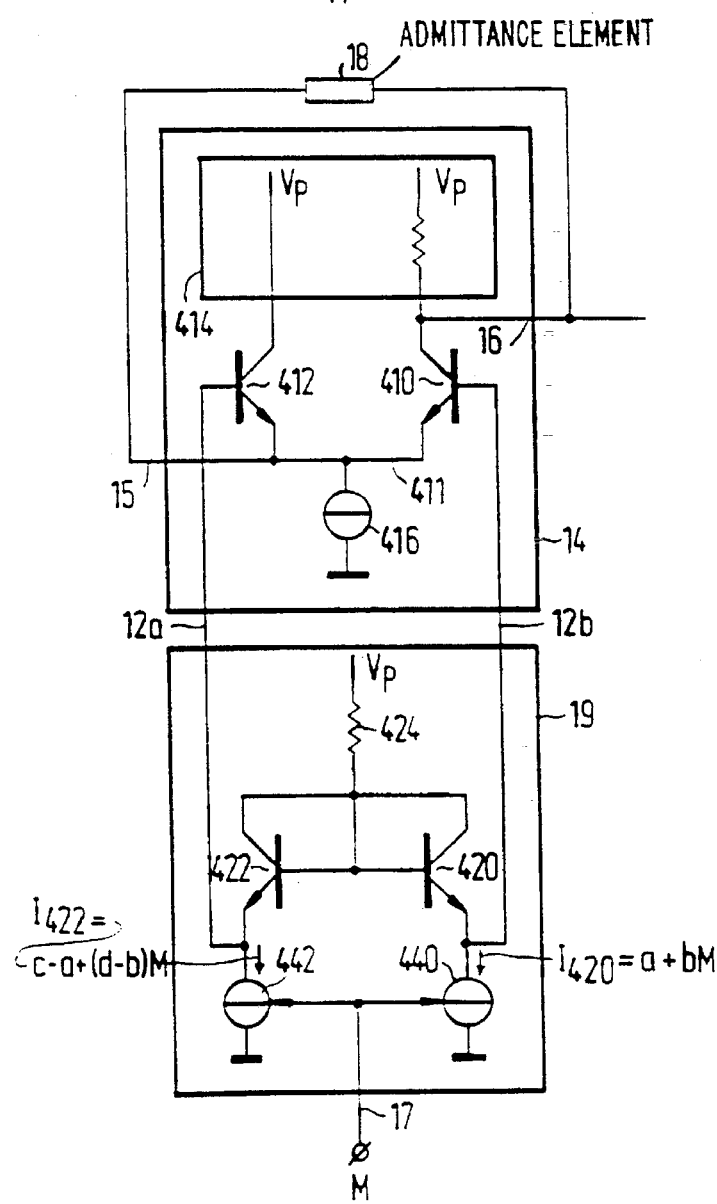
FIG. 2 shows a bipolar control and current multiplying circuit.

FIG. 2 shows a bipolar embodiment of the control circuit 19 and a bipolar embodiment of the current multiplying circuit 14.

The control circuit 19 has an input 17 for the control signal M. The input 17 is connected to control two controllable current sources 440, 442 linearly. The first controllable current source 440 is connected to a first diode 420. The second controllable current source 442 is connected to a second diode 422. The diodes 420, 422 are shown as transistors with their collectors connected to their bases and to each other. The collectors of the transistors 420, 422 are connected to the power supply $V_p$ via a load 424. The output of the control circuit 19 is formed by the emitters of the first and second diodes 420, 422. Instead of transistors 420, 422, ordinary diodes may be used.

The current multiplying circuit 14 contains a differential pair of a first and a second transistor 410, 412 with their emitters 411 connected to each other. The connection of the emitters 411 is connected to ground via a current source 416. The collectors of the first and second transistor are connected to the power supply $V_p$ via a load circuit 414, shown as a resistor 414a between the collector of the first transistor and the supply $V_p$. The connection of the emitters 411 forms the current input 15, the collector of the first transistor forms the current output 16 of the current multiplying circuit 14.

The control input 12a, 12b of the current multiplying circuit 14 is formed by the bases of the first and second transistor 410, 412. The base of the first transistor 410 in the current multiplying circuit 14 is connected to the emitter of the first diode 420 in the control circuit 19. The base of the second transistor 412 in the current multiplying circuit 14 is connected to the emitter of the second diode 422 in the control circuit 19.

In operation, the current supplied to the current input 15 will flow in part through the collector emitter channel of the first transistor 410 of the current multiplying circuit 14. The remaining part flows through the second transistor 412. The part that flows through the first transistor 410 is forcibly delivered at the current output 16. Hence the current multiplication coefficient $\alpha$ corresponds to the fraction of the input current that flows through the first transistor 410. This fraction is under control of the control circuit 19.

In operation, the difference between the base-emitter voltages of the first and the second diodes 420, 422 in the control circuit 19 is equal to the difference between the base emitter voltages of the first and second transistor 410, 412 in the current multiplying circuit 14. For bipolar transistors this entails that the ratio between the current densities of the first and second diodes 420, 422 is equal to the ratio of the current densities of the first and second transistor 410, 412 in the current multiplying circuit 14:

$$\frac{i_{420}}{i_{422}} = \frac{i_{410}}{i_{412}}$$

The current multiplication coefficient $\alpha$ is the ratio of the current $I_{410}$ through the first transistor 410 and the sum of the currents $I_{410}, I_{412}$ through the first and second transistors 410, 412. This ratio can be expressed in the currents through the diodes 420, 422 using the formula above. When the emitter areas of the first and second transistor 410, 412 are equal, that is, when the ratio of their currents equals the ratio of their current densities, the current multiplication coefficient is $$\alpha = \frac{i_{420}}{i_{422} + i_{420}}$$

When the sum of the current densities through the first and the second diodes 420, 422 depends linearly on the control signal M, the current multiplication coefficient $\alpha$ is equal to a ratio $f_1/f_2$ of two factors, where the second factor $f_2$ depends polynomially on the control signal M. For ease of description, this relationship will be described with reference to a linear (first degree polynomial) relationship between f2 and M.

According to FIG. 2, this is realized by controlling the first and second controllable current source 440, 442 separately to generate a first current signal $I_{420}$ for the first diode 420 and into a second current signal $I_{422}$ for the second diode 422. These currents are made to depend linearly on the control signal M: $I_{420}=a+bM$, $I_{422}=(c-a)+(d-b)M$. The control parameters a, b, c, d are chosen such that the sum of the two currents is dependent on the control signal M (d is not zero) and that the two dependencies are not strictly proportional to each other (a/c is not equal to b/d).

By substituting these expressions for the currents $I_{420}$, $I_{422}$ in the expression for the multiplication coefficient $\alpha$, it follows that the current multiplication coefficient $\alpha$ is given by $$\alpha = \frac{a + bM}{c + dM}$$

Hence the current multiplication factor $\alpha$ is a ratio of two factors $f_1/f_2$, the factor $f_2$ in the denominator depending linearly on the control signal M. The factor $f_1$ in the numerator may be kept constant or may also be made a linear function of the control signal M. In this way, it is possible to control the effective admittance value $Y_{eff}$ of the circuit inversely linear with the control signal M.

Figure 3:
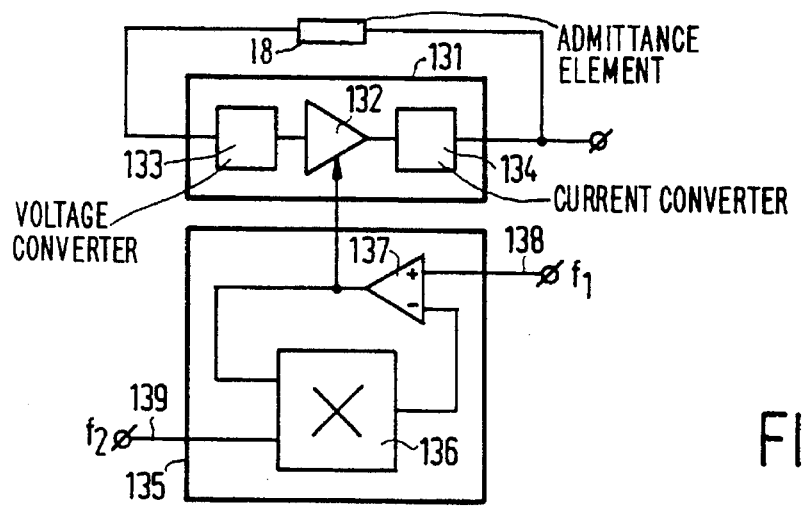
FIG. 3 shows a further control and current multiplying circuit.

FIG. 3 shows how a similar dependence may be realized using any current amplifier 13 1 with a gain control input. The output of a multiplier and division circuit 135 is connected to the gain control input. This multiplier and division circuit 135 will carry at its output the ratio of the signals presented at its inputs is coupled.

The current amplifier may be realized for example as a voltage amplifier 132, provided with a current to voltage convertor 133 and a voltage to current converter 134 at its input and output respectively. The multiplier and division circuit 135 may be implemented with a two input multiplier 136 with a feedback amplifier 137 between its output and one of its inputs.

In operation one factor $f_2$ is supplied to a first one of the inputs 139 of the multiplier 136. The signal at the second input, which is connected to the feedback amplifier 137, is regulated by this amplifier such that the output signal of the two input multiplier 136 is equal to the other factor $f_1$. As a consequence, the signal value at the second input will be the ratio $f_1/f_2$ which can be used to control the amplifier 131 via its gain control input. This achieves the same effect as the much more compact circuit of FIG. 2.

Both the input for f1 138 and f2 139 may moreover be provided with a polynomial computation circuit, (comprised of multiplication circuits and adding/subtracting circuits) for cumputing polynomial functions of the control signal M. In this way more general polynomial relations between the effective admittance and the control signal can be realized.

Application of Inversely Linearly Adjusted Admittances

As shown in FIGS. 2 and 3 the control circuit 19 is arranged to make the multiplication coefficient equal to a ratio $f_1/f_2$ of two factors. At least the factor in the denominator varies linearly with the control signal M:

$$\alpha = \frac{a + bM}{c + dM}$$

As shown in the preceding, the effective admittance $Y_{eff}$ of the circuit 10 will take the form $$Y_{eff} = Y_{ref} \frac{c - a + (d - b)M}{c + dM}$$

This form of dependence on the control signal M makes it possible to control various electronic parameters in a linear way.

When b=d, the effective impedance (that is, the inverse of the effective admittance $Y_{eff}$) is made a linear function $(c+dM)/(c-a)Y_{ref}$ of the control signal M.

Figure 4:
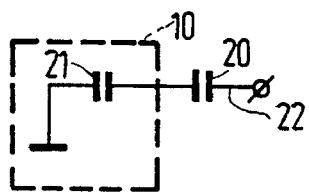
FIG. 4 shows a circuit context for a circuit for presenting an adjustable effective admittance value at an output terminal.

In FIG. 4 the effective admittance, by way of example a capacitor 21 of the circuit 10 is placed in series with a further admittance 20 having an admittance value $Y_f$. The total serial admittance $Y_{tot}$ is $$C_{tot} = \frac{C_{eff} C_{21}}{C_{eff} + C_{21}}$$

substitution of the expression for the effective impedance in dependence of the control signal M yields $$Y_{tot} = Y_f Y_{ref} \frac{c - a + (d - b)M}{Y_f(c + dM) + Y_{ref}(c - a + (d - b)M)}$$

By selecting a combination of b and d such that $b/d=1+Y_f/Y_{ref}$, the denominator will be made independent of the control signal M. This results in a linear dependence of the total serial admittance $Y_{tot}$ on the control signal M. Note that this is only possible when d is not equal to zero, which means that the factor $f_2$ in the denominator of the expression for $\alpha$ depends linearly on the control signal M.

The process by which the series admittance is linearized can be elucidated mathematically by modelling the effective admittance $Y_{eff}$ of the circuit 10 as a series arrangement of a control signal M independent series admittance (having an admittance $Y_{ser}$) and a linearly control signal M dependent admittance (having an admittance $Y_{lin}$). With some algebra, the admittances $Y_{ser}$, $Y_{lin}$ can be computed:

$$Y_{lin} = Y_{ref} \frac{d - b}{ad - bc} (c - a + (d - b)M)$$

$$Y_{ser} = Y_{ref} \left( \frac{b}{d} - 1 \right)$$

by a suitable choice of b and d (b/d<1) the series admittance may be made negative (incidentally, the complete effective admittance does not become negative). This explains the ability to compensate the non linear effect of a further admittance placed in series with the effective admittance.

The admittance of a capacitor is proportional to its capacitance value. Therefore, when the admittance element is a capacitance, it can be modeled as a series arrangement of a control signal M independent series capacitance $C_{ser}$ and a linearly control signal M dependent admittance $C_{lin}$. The corresponding capacitance values $C_{lin}$, $C_{ser}$ are $$C_{lin} = \mu C_{ref}(c - a + (d - b)M) \text{ with } \mu = \frac{d - b}{ad - bc}$$

$$C_{ser} = C_{ref} \left( \frac{b}{d} - 1 \right)$$

and by a suitable choice of b and d (b/d<1) $C_{ser}$ can be made negative. If the effective admittance is placed in series with a further capacitance $C_f$ with the same capacitance value as $C_{ser}$ but of opposite sign: $C_f = -C_{ser}$, the effect of the further capacitance $C_f$ and the serial capacitance $C_{ser}$ on the combined capacitance will cancel and the combined capacitance will depend linearly on the control signal M.

Figure 5:
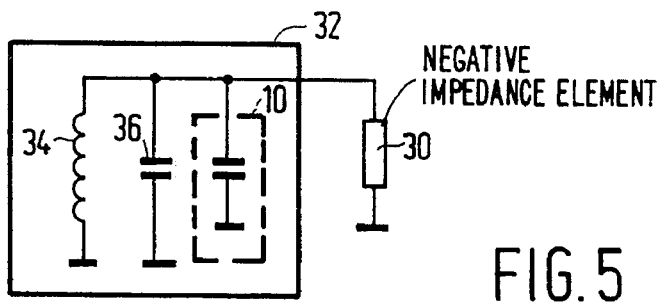
FIG. 5 shows a tunable oscillating circuit.

A further possibility of non linear control, concerning linear frequency adjustment of an LC oscillator, is illustrated using FIG. 5. (The adjustment may be used for example to provide for frequency modulation with the control signal M). FIG. 5 shows an example of an oscillating circuit, comprising a negative impedance element 30, connected to a tank circuit 32. The tank circuit contains a parallel arrangement of an inductor 34 and a capacitance circuit, in this case implemented as the parallel arrangement of a capacitor 36 and the circuit 10 of FIG. 1. (This LC circuit is a representative example: similar problems concerning linear adjustment apply to many well known LC oscillator structures). As is known for oscillator circuits, the combination of the negative impedance element 30 (containing for example a feedback amplifier) and the tank circuit 32 will oscillate at a frequency $$f = \frac{1}{2\pi \sqrt{L(C_{eff} + C_{36})}}$$

In many applications, the control signal M will need to change the oscillating frequency linearly if only over a small range. One may get a reasonable approximate linearity if the second derivative of the oscillating frequency with respect to the control signal M were zero at the nominal frequency (that is, by definition, that the relation between oscillating frequency and control signal M had an inflexion point at the nominal frequency). The condition for an inflexion point is $$\frac{d^2f}{dM^2} = 0 \rightarrow \frac{d^2C_{eff}}{dM^2} - \frac{3}{2} \frac{1}{C_{eff} + C_{36}} \left(\frac{dC_{eff}}{dM}\right)^2 = 0$$

In case the relation between the effective capacitance $C_{eff}$ and the control signal M is linear, the first derivative of the capacitance $C_{eff}$ with respect to the control signal M is not zero and the second derivative of the capacitance $C_{eff}$ with respect to the control signal M is zero. In this case the first term on the left hand side of the equation above is zero and the second term is not zero. Therefore with a linear relation between the capacitance value and the control signal M an inflexion point cannot be realized.

Non-linear control of the capacitance value makes it possible to introduce an inflexion point in the dependence of the oscillating frequency on the control signal M for the oscillator circuit shown in FIG. 5. As discussed above, in this case the adjusted capacitance may be modelled as a serial arrangement of a linearly variable capacitance $C_{lin}$ and a constant capacitance $C_{ser}$. With some algebra it follows that the first and second derivative of the effective admittance with respect to the control signal M are $$\frac{dC_{eff}}{dM} = \frac{\mu(d-b)C_{ser}^2}{(C_{ser} + C_{lin})^2}, \frac{d^2C_{eff}}{dM^2} = \frac{(\mu(d-b))^2 C_{ser}^2}{(C_{ser} + C_{lin})^3}$$

($\mu$ being the proportionality constant from the expression for $C_{lin}$). Hence, in combination with the condition for the inflexion point given above (with $C_{36}=0$ for simplicity), it follows that an inflexion point occurs when $$\frac{C_{ser}}{C_{lin}} = -\frac{4}{3}$$

This happens when the series capacitance $C_{ser}$ is given a negative value, i.e. when b/d<1 ($C_{lin}$ will then be positive because $C_{eff}$ must be positive); An inflexion point never occurs when a positive linearly variable capacitance in any combination with positive constant capacitances is used as capacitive part of a tank circuit.

By appropriate selection of values for a, b, c, d the inflexion point can be set to the desired nominal oscillating frequency and for a selected value of the control signal M.

Figure 6:
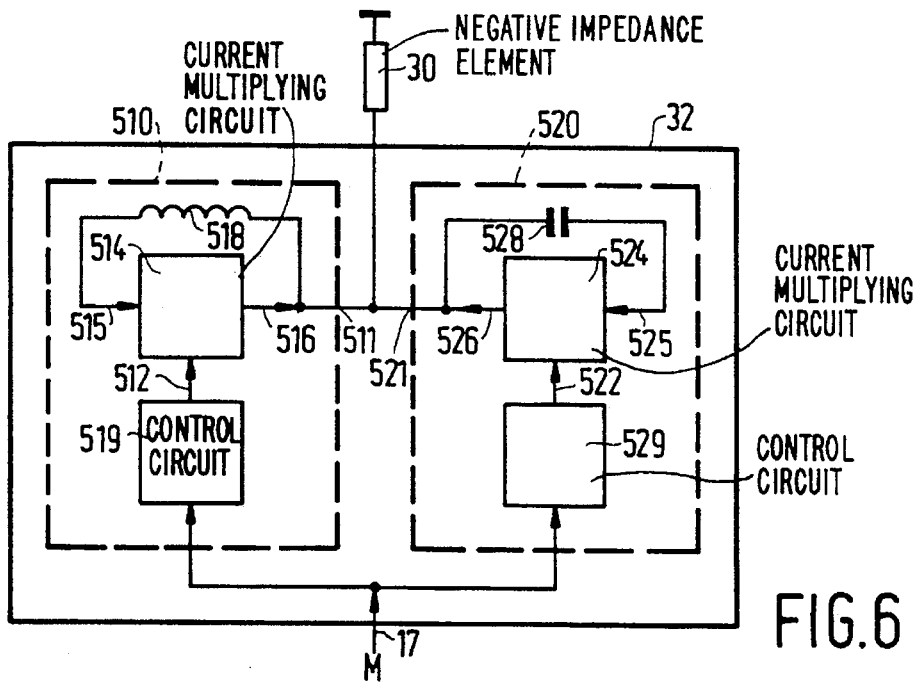
FIG. 6 shows a further tunable oscillating circuit.

If a linear relation between the oscillating frequency and the control signal M is required over the whole operating range one may employ the oscillating circuit shown in FIG. 6. This circuit contains the negative resistance element 30 and a tank circuit 32. In the rank circuit, both the inductor and the capacitor are adjusted. For this purpose, the tank circuit 32 has an input 17 for a control signal M of two admittance adjusting circuits 510 and 520.

In the first admittance adjusting circuit 510 the input 517 is coupled to a first control circuit 519, which has an output connected to a control input 512 of a first current multiplying circuit 514. The current input 515 and the current multiplying output 516 of the first current multiplying circuit 514 are connected via a first admittance element: an inductor 518.

In the second admittance adjusting circuit 520 the input 517 is coupled to a second control circuit 529, which has an output connected to a control input 522 of a second current multiplying circuit 524. The current input 525 and the current multiplying output 526 of the second current multiplying circuit 524 are connected via a second admittance element: a capacitance 528.

Both the output terminal 511, 521 of the first and second admittance adjusting circuit 510, 520 are connected to the tank circuit 32.

The principle of the circuit is that the parameters $a_1$, $b_1$, $c_1$, $d_1$, $a_2$, $b_2$, $c_2$, $d_2$ of the respective admittance adjustment circuits 510, 520 are set such that the effective admittance values of the first and second admittance adjusting circuit are adjusted inversely proportional to each other as follows:

$$Y_1 = \frac{1}{i\omega L} (c_1 - a_1 - b_1 M)/c_1,$$

$$Y_2 = i\omega C \frac{c_2 - a_2}{(c_2 + d_2 M)}$$

where $(c_1-a_1)/c_2=-b_1/d_2$ (and $d_1=0$, $b_2=d_2$). L and C are the inductance and capacitance value respectively of the inductor 518 and the capacitor 528 used as admittance element in the first and second admittance adjusting circuit 510, 520, $\omega$ is the angular frequency on which the admittance values depend.

As a consequence, the resonance frequency will be a linear function of the control signal M:

$$f = \frac{1}{2\pi \sqrt{LC}} \sqrt{\frac{c_1 - a_1}{c_2 - a_2} \frac{1}{c_1 c_2}} (c_1 + d_1 M)$$

The invention is not limited to the simple LC circuit shown in FIG. 5. Various further inductances and capacitances may be included in the negative resistance element 32 or in the connection between the admittance adjustment circuits 510, 520. Any effect of such inductances and capacitances on the linearity of frequency control can be compensated by a suitable choice of parameters in the adjusting circuits, in the same way as the effect of a serial capacitance upon the capacitance value can be eliminated.

Other Admittance Adjustment Circuits

Figure 7:
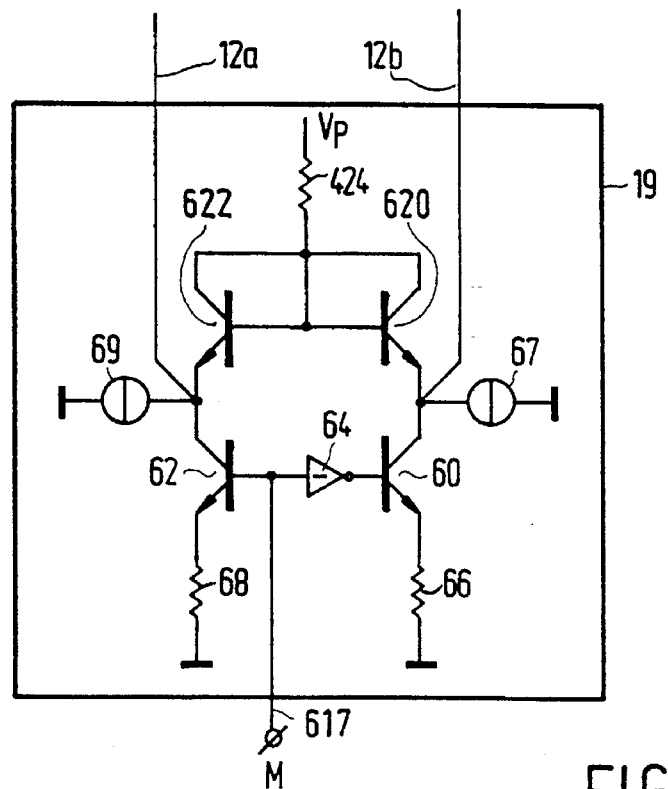
FIGS. 7 to 10 show various control circuits.

The control circuit 19 may be implemented in various ways. A first embodiment of the control circuit 19 is shown in FIG. 7 as circuit 619. This circuit is similar to the control circuit shown in FIG. 2. However, the controllable current sources 440, 442 have been replaced, by a first and second input transistor 60, 62. The input for the control signal M 617, is coupled to the base of the second input transistor 62 and via an inverting amplifier 64 to the base of the first input transistor 60. The emitters of the first and second input transistor are coupled to ground respectively via a first and a second resistor 66, 68. The collectors of the first and second input transistor are coupled to the emitters of respectively the first and second diode 620, 622, which are the equivalent of the diodes 420, 422 of FIG. 2. Additional current sources 67, 69 are connected to the collector of the first and second input transistor.

In operation, the control signal M is supplied as a voltage on the input 617 for the control signal M. The value of the resistors 66, 68 may be used to adjust the parameters b, d.

The amplification factor $S_{64}$ of the amplifier 64 may be used to change the sign of b/d−1. The currents $I_{67}$, $I_{69}$ of the additional current sources 67, 69 may be used to adjust a and c:

$$a = I_{67}, b = 1/R_{68}, c - a = I_{69}, d - b = -\frac{S_{64}}{R_{66}}$$

Figure 8:
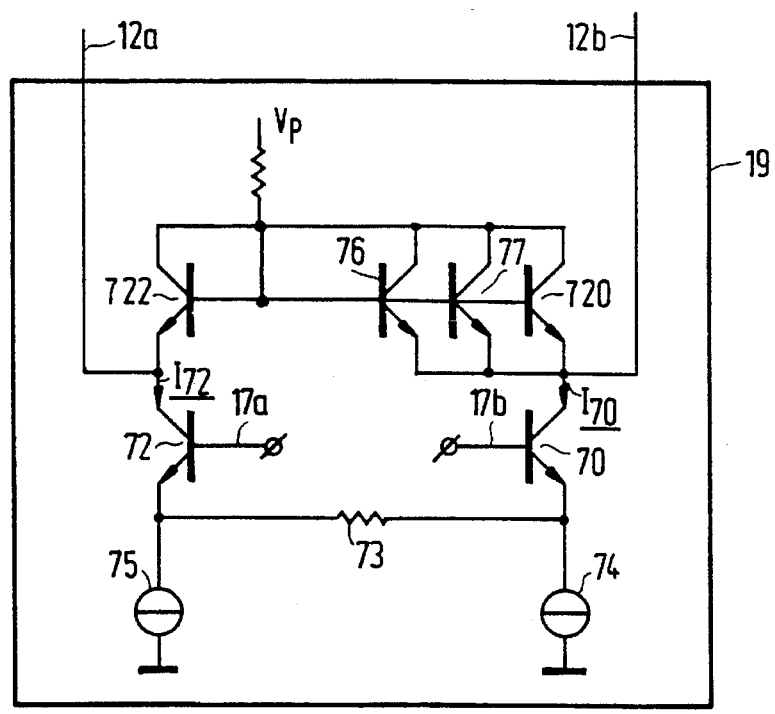

A second embodiment of the control circuit 19 is shown in FIG. 8. This circuit is also similar to the control circuit of FIG. 2. In FIG. 8 the controllable current sources 440, 442 have been replaced, by a first and second input transistor 70, 72, which have their emitters coupled via a resistor 73. The emitters are connected to ground via respective current sources 74, 75. These transistors constitute a differential amplifier, their bases forming the respective terminals 717a, 717b of a differential input. The collector of the first input transistor 70 is connected to the emitter of the first diode 720. The collector of the second input transistor 72 is connected to the emitter of the second diode 722. Two additional diodes 76, 77 are arranged in parallel to the first diode 720.

In operation, the control signal M is supplied as a voltage difference $V_{dif}$, supplied between the bases of the first and second input transistor 70, 72. The difference between the collector currents $I_{70}$, $I_{72}$ is proportional the voltage difference $V_{dif}$ divided by the resistor 73 which connects the emitters: $I_{70}-I_{72}=V_{dif}/R_{73}$. The sum of the collector currents $I_{70}$, $I_{72}$ of the first and second input transistor 70, 72 is independent of the difference voltage $V_{dif}$ and equal to the sum of the currents $I_{74}$, $I_{75}$ produced by the current sources 74, 75.

If the arrangement of the first and second diode 420, 422 were copied from FIG. 2, the denominator of the current multiplication coefficient α would not depend on the control signal M. However, in FIG. 8, two additional transistors 76, 77 which serve as diodes are shown in parallel to the first diode 720. Two thirds of the collector current $I_{70}$ of the first input transistor is drawn by the additional diodes. The first diode draws one third of the collector current $I_{70}$ of the first input transistor. As a consequence, the sum of the currents drawn by the first and second diode 720, 722 depends on the control signal M. The following holds for the parameters a, b, c, d:

$$c = L_{75} + NL_{74}, d = \frac{N-1}{2R_{73}}, a = NI_{74}, b = \frac{N}{2R_{73}}$$

Here N is the fraction of the collector current $I_{70}$ of the first input transistor drawn by the first diode 720: for FIG. 8 N=⅓. In general, of course any number of transistors may be placed in parallel with the first and/or second diodes and N may be given any arbitrary value. When the circuit is implemented in an integrated circuit, the fraction N may be controlled by using a single transistor 720 instead of the three transistors 720, 76, 77. The adjusting the ratio of the emitter areas $A_{720}$, $A_{722}$ of the first and second diode; in this case N is equal to N=$A_{722}/A_{720}$.

The same effect is achieved by giving the first and second transistor 410, 412 in the current multiplying circuit 14 mutually different emitter areas: effectively N is equal to N=$(A_{412}A_{720})/(A_{722}A_{410})$. However, when the frequency of the signal presented to the current input 15 and current output 16 of the current multiplying circuit is very high (in the several hundred megahertz range, for example 500 Mhz), it is preferred that the first and second transistors 410, 412 in this circuit have equal emitter areas: $A_{410}=A_{412}$.

The advantage of using emitter areas for adjusting the parameters a, b, c, d is that the important ratios between these parameters, such as b/d can be realized very accurately. This is because relative areas of transistors can be controlled to better than 1 part in 1000 in manufacturing the transistors on an integrated circuit.

Figure 9:
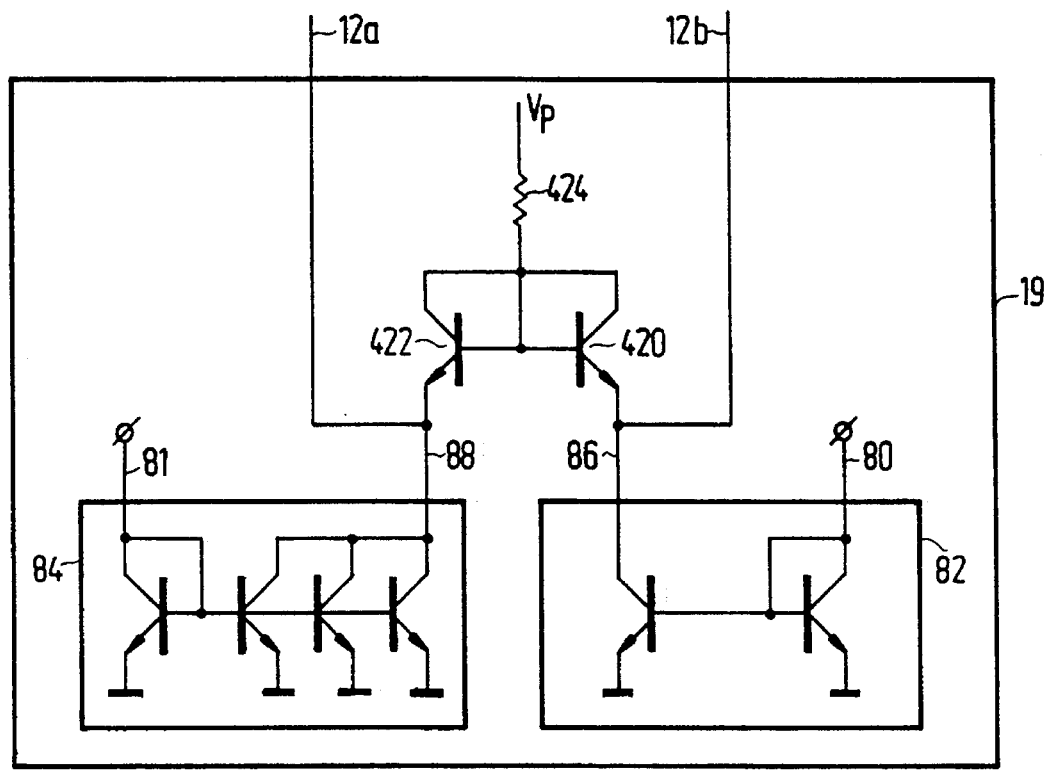

It should be noted that it is by no means necessary that the ratio between areas is realized in the diodes 720, 722. FIG. 9 shows an example of an alternative control circuit. This circuit has two inputs 80, 81 for currents, each having its own linear dependencies on the control signal M (such currents may for example generated using an equivalent of pan 70, 72, 73, 74, 75 of the circuit shown in FIG. 8, such that the sum of the input currents is independent of the control signal M). The inputs are connected to the control inputs of respective current minor circuits 82, 84. The outputs 86, 88 of the current mirror circuits are coupled to the diodes 420, 422 shown earlier.

The current mirrors 82, 84 have mutually different current amplification factors, which are realized by using transistors with mutually different emitter areas (shown symbolically by drawing the output transistor of the current mirrors as a triple transistor). The ratio N' between the current multiplication factors of the current mirrors 82, 84 influences the current multiplication coefficient α in the same way as the area ratio $A_{720}/A_{722}$ of the first and second diode 720, 722.

Figure 10:
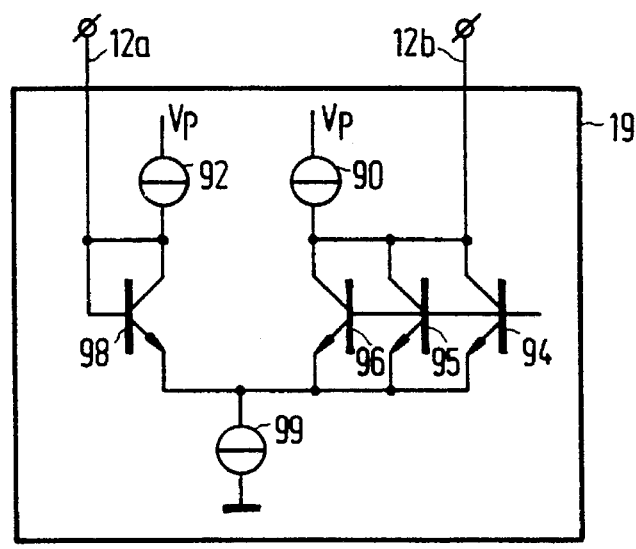

The diodes 420, 422 can be arranged in several ways. One example is shown in FIG. 10. The circuit in this Figure contains two controllable current sources 90, 92. (These current sources may be similar to those shown in FIGS. 7, 8, 9). The controllable current sources are respectively coupled to the collectors of two diodes (94, 95, 96, 98) shown as transistors, the first of which is shown as a threefold transistor to symbolize that it has a larger emitter area than the second transistor. The collector of the first transistor 94, 95, 96 is coupled to its base. The collector of the second transistor 98 is coupled to its base. The emitters of the first and second transistors 94, 95, 96, 98 are coupled to each other and via a current source 99 to ground. The bases serve as output for the control circuit (and are coupled to the bases of the first and second transistor 410, 412 of the current multiplying circuit 14, not shown).

The essential point is that, as in FIG. 2, the circuit is arranged to ensure that the voltage difference between the outputs of the control circuit corresponds to the difference between the base emitter voltages of the diodes. This difference is in response to the currents supplied to the collectors of the diodes. Therefore the current multiplying coefficient is similarly controlled as in the circuit of FIG. 2.

Without affecting the function of the circuit, the diode coupled transistors 420, 422, 94, 95, 96, 98 may also be replaced by ordinary junction diodes. Various other circuits may be used for generating a difference between two voltages across junctions and supplying this difference across the bases of the transistors 410, 412 of the differential pair. For example, one might use the circuit disclosed in U.S. Pat. No. 4,109,214, with the modification that the difference between the emitter voltages is taken from transistors with mutually different emitter areas.

Figure 11:
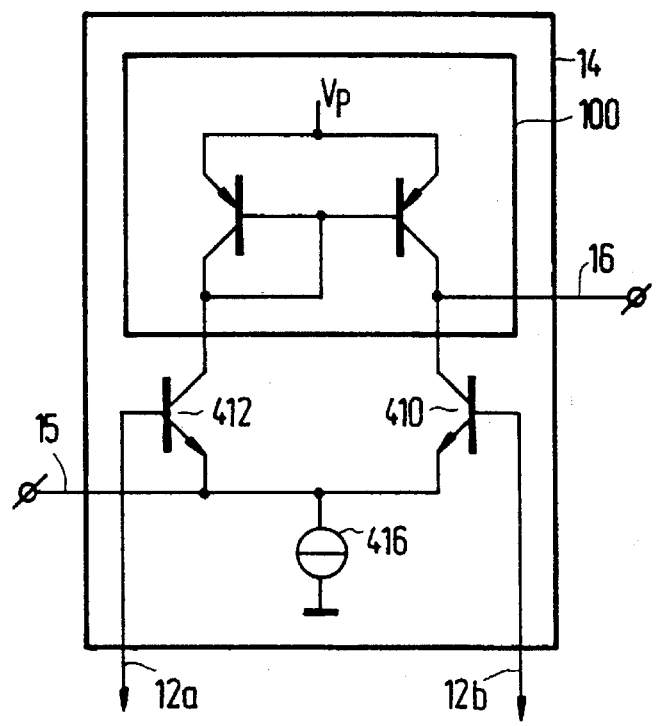
FIGS. 11 and 12 show current multiplying circuits.

FIG. 11 shows an alternative current multiplying circuit 14. Instead of a resistor connected to the collector of the first transistor 410, a current mirror 100 is used with its input coupled to the collector of the second transistor 412 of the current multiplying circuit 14. The output of the current mirror 100 is coupled to the collector of the first transistor 410.

In operation, not only the part of the input current from the current input 15 drawn by the first transistor 410, but also the part of the input current drawn by the second transistor 412 reaches the current output 16. This results in the following relation between the current multiplying coefficient a and the emitter current densities $i_{420}$, $i_{422}$ through the diode coupled transistors 420, 422.

$$\alpha = \frac{i_{420} - i_{422}}{i_{420} + i_{422}}$$

This expression for α differs from the expression which obtains for the circuit of FIG. 2. However, it shares the essential characteristic that a sum of current densities appears in the denominator. Therefore it is possible to achieve the same type of relation between the effective admittance value and the control signal M as before with the circuit of FIG. 11, provided that the relation between the control signal M and the currents supplied to the diodes 420, 422, is slightly modified: $i_{420}$=a+c+(b+d)M and $i_{422}$=c−a+(d−b)M.

Figure 12:
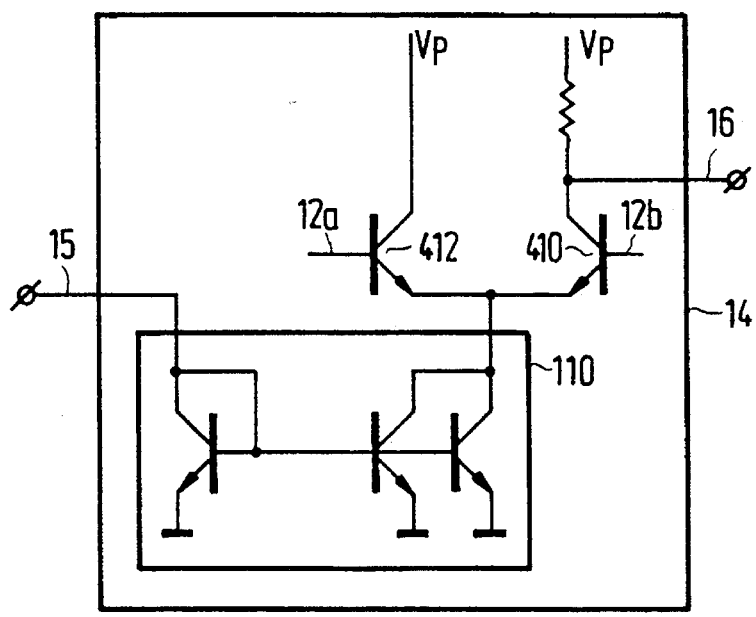

FIG. 12 shows a further modification of the current multiplying circuit 14. In this case, the current input 15, is connected to the input of a current mirror 110. The output of this current mirror is connected to the common connection of the emitters of the first and second transistor 410, 412. The output transistor of the current mirror 110 is shown as a double transistor, to symbolize that its emitter area may differ from that of the input transistor of the current mirror 110.

In operation, the current mirror 110 will supply an output current to the common connection of the emitters of the first and second transistor 410, 412. This output current is a multiple of the current the input of the current mirror 110. When the ratio between the emitter area of the output and the input transistor of the current mirror is μ, the current multiplication factor between input and output will be μ. The current multiplication coefficient α of the current multiplying circuit 14 is $$\alpha = -\mu \frac{i_{420}}{i_{420} + i_{422}}$$

That is, it will have a different sign and magnitude as compared to the circuit in FIG. 2. The magnitude may be adjusted very accurately using the emitter areas of the transistors in the current mirror 110. The extra factor μ gives an additional opportunity to adjust the effective admittance.

The extra factor μ has the additional advantage that it makes it possible for provide effective admittance values $Y_{eff}$ which are larger than the admittance value $Y_{ref}$ of the admittance element 18. Something which is not possible with the circuit of FIG. 2. This may be of interest especially when the admittance element is an integrated capacitance.

Figure 13:
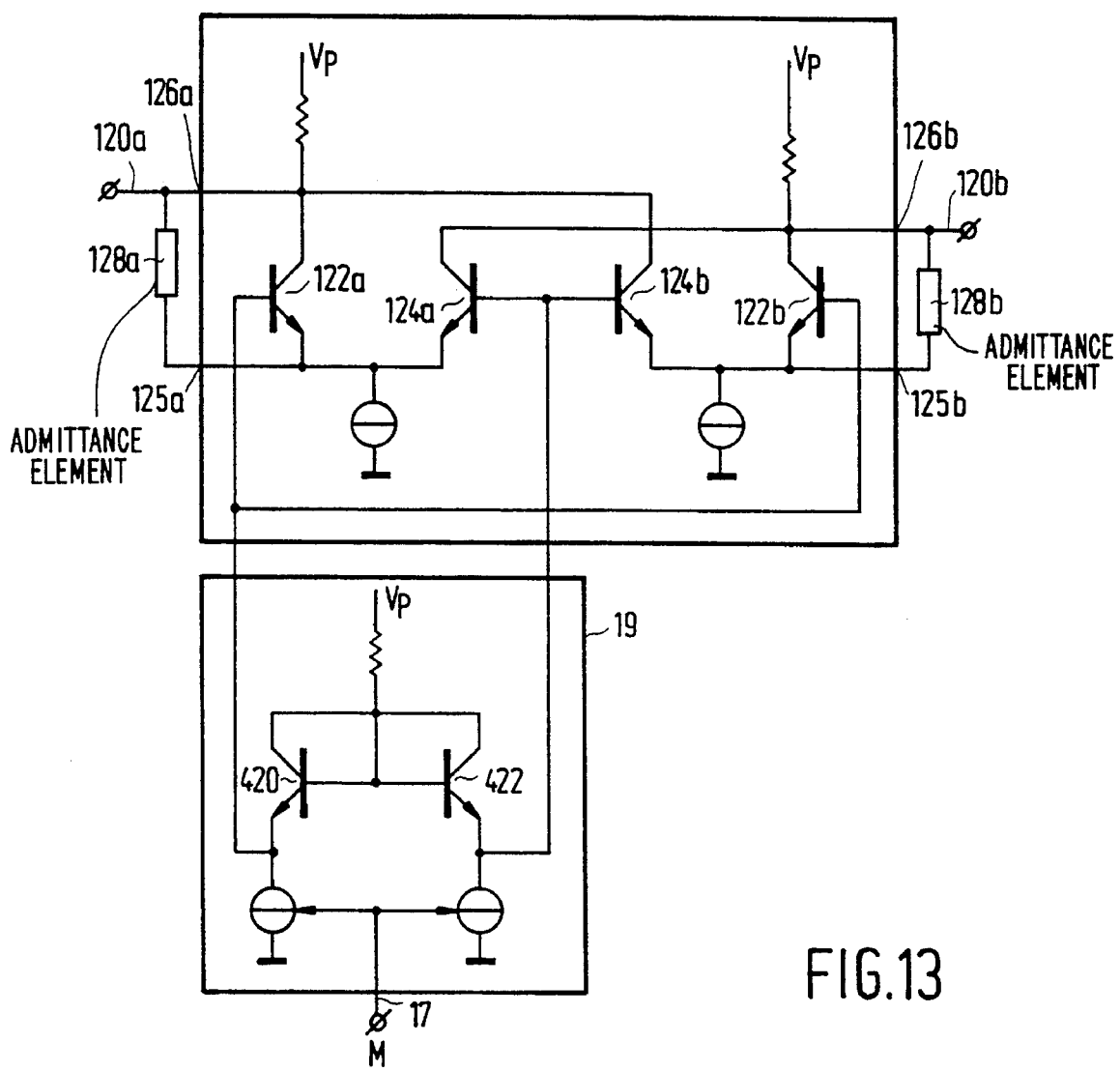
FIG. 13 shows a symmetric circuit for presenting an adjustable effective admittance value at an output terminal.

FIG. 13 shows a symmetric circuit with an adjustable effective admittance. The circuit is similar to that of FIG. 2, except that it has a symmetric current multiplying circuit. This multiplying circuit contains a first and second transistor pair. The first transistor pair contains a first and second transistor 122a, 124a, with their emitters mutually connected. The bases of the first and second transistor 122a, 124a are coupled to the emitters of a third and fourth transistor 420, 422, which are used as diodes. The second transistor pair contains a fifth and sixth transistor 122b, 124b, with their emitters mutually connected. The bases of first and second the transistor 122a, 124a are coupled to the respective bases of the fifth and sixth transistor 122b, 124b in the further pair. The collectors of the first and second transistor 122a, 124a are connected to the collectors of the sixth and fifth transistors 122b, 124b respectively. In this way the collectors and bases of the pairs are connected (122a, 124a) (122b,124b), but the base and collector of each transistor are connected to mutually different transistors.

The current multiplying circuit has two current inputs 125a, 125b, connected respectively to the common emitter connection of the first and second transistor 122a, 124a, and to the common emitter connection of the fifth and sixth transistor 122b, 124b. The current multiplying circuit has two current outputs 126a, 126b, coupled to the collectors of the first and second transistor 122a, 124b respectively.

The circuit contains two admittance elements 128a, 128b each coupled between a current output 126a, 126b and a corresponding current input 125a, 125b. The circuit has two output terminals 120a, 120b, coupled to the two current outputs 126a, 126b.

In operation the circuit function is similar to that of the circuit shown in FIG. 2. The sum of any changes in the current drawn from the two outputs 120a, 120b in response to a voltage supplied to these outputs is zero. Hence the circuit draws a purely differential current. The difference between the currents drawn at the two outputs 120a, 120b, in response to the voltages supplied to these outputs is $$I_{120a} - I_{120b} = (1-\alpha)(Y_{128a}V_{120a} - Y_{128b}V_{120b})$$

When the admittance values $Y_{128a}$, $Y_{128b}$ of the admittance elements 128a, 128b are equal, the circuit behaves as a two ended effective admittance. This is in contrast to the circuit shown in FIGS. 1 and 4, which show a single ended effective admittance, that is an admittance which has one of its terminals of the admittance connected to ground.

The current changes in proportion to changes in the voltage difference applied between the two output terminals 120a, 120b. The proportionality constant, the effective admittance $Y_{eff}$, is the same as that for the single ended circuit.

The double ended admittance has the advantage that there is no net current from the output terminal to ground in response to the applied voltages. This reduces interference problems. When the double ended circuit is used in an oscillator in an integrated circuit other circuits will be less interfered with due to ground currents.

Figure 14:
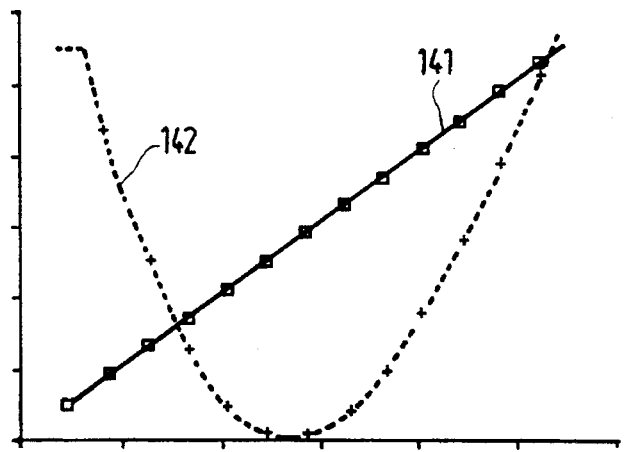
FIG. 14 shows the dependence of the oscillating frequency on the control signal M, for an oscillating circuit containing the adjustable effective admittance according to the invention

An example of the results obtained with the circuit of FIG. 13 are illustrated in FIG. 14.

FIG. 14 shows simulation results, for a double ended version of a practical oscillating circuit shown in FIG. 5. An inductor 34 of 30.5 nH was used in parallel with a capacitor 36 of 2.7 pF. The variable capacitor 10 was composed of a series arrangement of a 8.8 pF capacitor and a adjustable capacitance created with a circuit according to FIG. 13, with a control circuit according to FIG. 8. In the circuit, the two admittance elements 128a, 128b were capacitors of 2.8 pF. A ratio of 3:1 was used for the emitter areas of the transistors 420, 422. The oscillations frequency was thus approximately 480 Mhz.

FIG. 14 shows a graph in which the control signal M is plotted horizontally, and the oscillation frequency 141 and its derivative 142 with respect to the control signal M is plotted vertically. The vertical scales are offset: the baseline corresponds to a frequency and derivative greater than zero. The derivative is shown on a greatly expanded scale: its full vertical range corresponds to a change of derivative of approximately 1%. In the graph, the derivative changes slope; the point where its slope is zero corresponds to the inflexion point: the second order derivative is zero at this point.

Polynomially Adjusted Admittances

Figure 15:
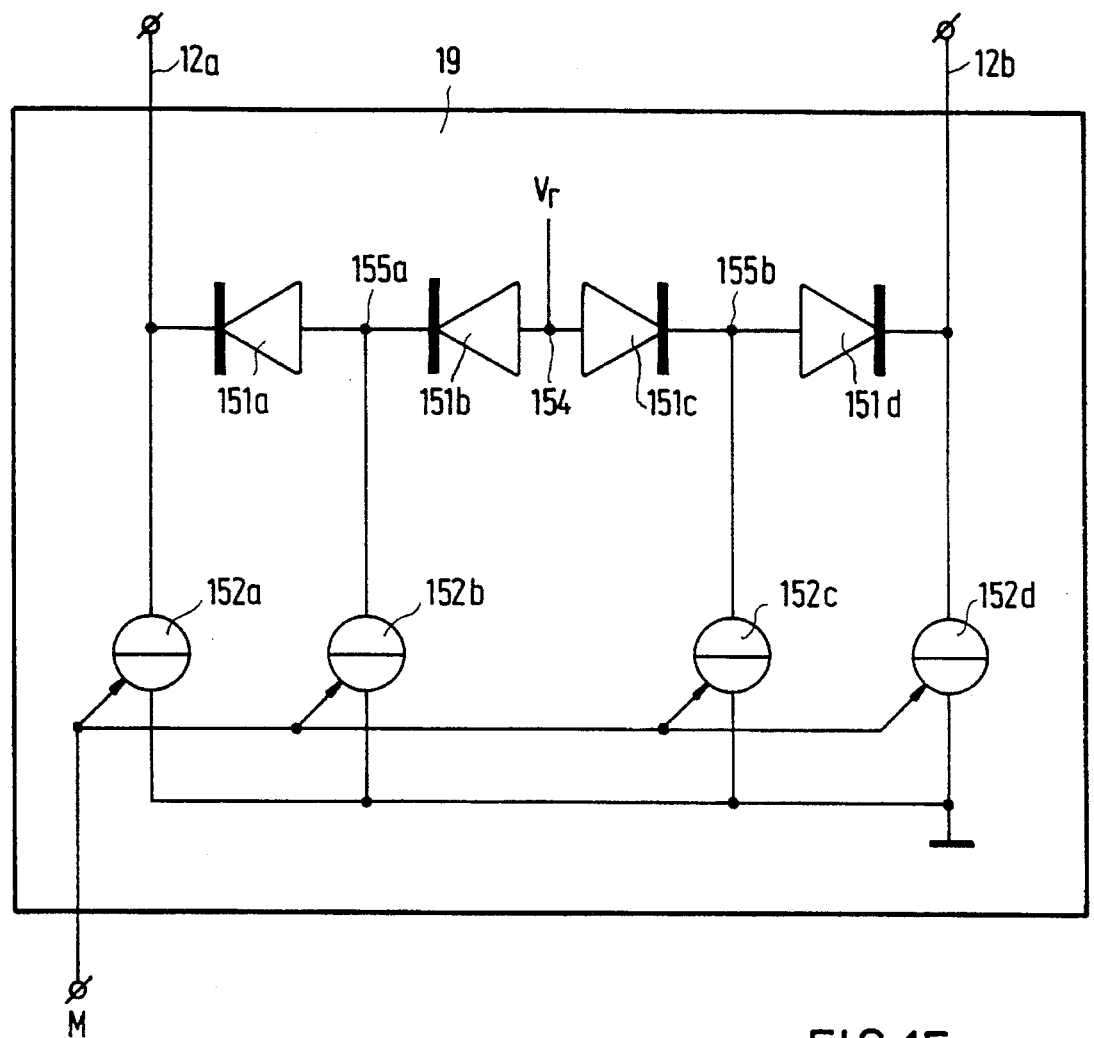
FIG. 15 shows a control circuit for satisfying a linearity requirement

From the above it will be appreciated that it is possible to build a circuit which exhibits an effective admittance which can be adjusted with a control signal M in such a way that various linearity requirements may be satisfied. A control circuit 19 for satisfying linearity requirements in another way is shown in FIG. 15.

The control circuit 19 according to this figure contains four diodes 151a–d between its outputs 12a,b. Midway between the outputs 12a,b there is a junction point 154 which is connected to a reference voltage $V_r$. This junction point 154 is connected via two diodes 151a,b in the forward direction to one output 12a, and via two further diodes 151c,d in the forward direction to the other output 12b. Furthermore, the control circuit 19 contains four current sources 152a–d, connected to the respective outputs 12a,b and further junction points 155a,b between the outputs 12a,b and the junction point 154. All current sources 152a–d are coupled to receive the control signal M.

In operation and in combination with a current multiplying circuit 14 such as shown for example in FIGS. 2 and 13, this control circuit provides for a current multiplication coefficient $\alpha$ which depends on the ratio of on one hand the product of the current densities $i_a$, $i_b$ through the diodes 150a,b which connect the junction point 154 to the one output 12a and on the other hand the product of the current densities through the diodes 150c,d which connect the junction point 154 to the other output 12b:

$$\alpha = \frac{1}{1 + i_a i_b / i_c i_d}$$

In operation, the current sources 152a–d serve to provide a linear control of the current through the individual diodes 151a–d. Thus the relation between the current multiplication coefficient $\alpha$ and the control signal M can be made a ratio of two quadratic polynomials. Similarly, the relation between the effective admittance $Y_{eff}$ and the control signal M can be made the ratio of two quadratic polynomials.

By including more than four semiconductor junctions such as diodes in series between the outputs 12a, 12b, and controlling the current densities through respective junctions also higher order polynomial relationships can be realized.

One example of an application is a resonance circuit. In this example, an inductance L is connected to the output 11 of the admittance modulating circuit of FIG. 1, and a capacitance is used as reference admittance 18. As described hereinbefore, the resonance frequency of this circuit varies as the inverse root of the capacitance. By using a circuit whereby the effective capacitance can be made to vary as the inverse square of a linear function of the control signal M (such as current multiplication circuit 14 of FIG. 2 in combination with control circuit 19 of FIG. 15), the resonance frequency of the resonance circuit can be made to depend linearly on the control signal M.

In practice, the inductance of the resonance circuit will always be accompanied by parasitic capacitance. The effect of such a capacitance on the linearity of the relation between the resonance frequency and the control signal can always be compensated by an appropriate choice of the relation between the current densities through the various diodes 151a–d.

For example, suppose that a parallel arrangement of an inductance L and a (possibly parasitic) capacitance C is connected between the output 11 of FIG. 1 and ground, the admittance element 18 being a capacitance $C_{ref}$. In this case the resonance frequency will be given by $$f = \frac{1}{\sqrt{2\pi L \left( C + \frac{C_{ref}}{1 + I_c I_d / I_a I_b} \right)}}$$

Using a current control circuit 152a–d, for example any one of the current density control techniques described hereinabove, the following relation between the current density through the diodes 151a–d and the control signal M may be provided $$I_a = I_0 \left( 1 + (a+M) \sqrt{\frac{C}{C + C_{ref}}} \right)$$

$$I_b = I_0 \left( 1 - (a+M) \sqrt{\frac{C}{C + C_{ref}}} \right)$$

$$I_c = I_0 (a + M + 1)$$
$$I_d = I_0 (a + M - 1)$$

In this case the relation between the resonance frequency and the control signal M will be $$f = (a+M) \sqrt{\frac{1}{2\pi L (C + C_{ref})}}$$

That is, the resonance frequency depends linearly on the modulating signal. Similarly, the effect of other parasitic components such as series capacitances may be compensated.

It will be appreciated that this effect depends on the use of the junctions of the diodes 151a–d, and that instead of diodes 151a–d junctions one may also use transistor junctions. Furthermore, it suffices that the appropriate sum of junction voltages is supplied to the outputs 12a,b. Instead of placing the junctions in series, which is the easiest way of providing a sum voltage, any sum forming circuit may be used. Furthermore the sequence of the junctions and the currents they draw going from one output 12a to the other 12b may be changed, or additional components or buffer amplifiers inserted.

From the above it will be appreciated that it is possible to build a circuit which exhibits an effective admittance which can be adjusted with a control signal M in such a way that various linearity requirements may be satisfied. This can be done with high accuracy by using relative emitter areas to adjust the dependence on the control signal M. It will be appreciated that the Figures given serve merely as examples. For example, one may introduce various resistors in places in FIG. 2 were little or no current flows, or in places which are driven by a current source, as this will not effect the performance of the circuit.

Furthermore it will be appreciated that the formulas given represent an idealization, giving a first indication of how component values should be selected. In the design of practical circuits it is advisable to use circuit simulation for assessing which values are appropriate in a given application.

We claim:

1. An integrated circuit comprising adjusting means for adjusting at least one electric parameter of the integrated circuit, the adjusting means being arranged for adjusting an effective admittance value of an effective admittance circuit comprising an admittance element, a parallel circuit, coupled in parallel to the admittance element, and arranged for conducting a parallel current $I_p$ in parallel with a current through the admittance element, the adjusting means comprising
  a control circuit, having an output coupled to a control input of the parallel circuit and an input for receiving a control signal M for controlling the conducting of the parallel circuit,
and wherein the parallel circuit is arranged for making the parallel current $I_p$ proportional to a reference current $I_{ref}$ through the admittance element: $I_p = \alpha\, I_{ref}$. With a proportionality coefficient $\alpha$, the control circuit being arranged for setting the coefficient $\alpha$ in a non-linear dependence on the control signal M, the dependence being a ratio $f_1/f_2$ of a first and second factor of which the second factor $f_2$ depends substantially polynomially on the control signal M and the first factor need not depend on the control signal M.

2. An integrated circuit according to claim 1, wherein
  the parallel circuit comprises a differential pair of a first and second transistor with their emitters coupled to each other, the admittance element being coupled in parallel to a collector emitter path of the first transistor,
  the control circuit comprises a first diode and a second diode coupled together in mutually opposite polarity directions and wherein a first end of the first diode is coupled to a base of the first transistor and a first end of the second diode is coupled to a base of the second transistor such that between the respective bases of the first and second transistors, a voltage corresponding to a sum of voltages occurring in mutually opposite polarity directions across the first and second diodes respectively is supplied, the control circuit including first and second current signal sources coupled to the diodes and coupled to receive control signal M for making a sum of a first and second current density $i_1$, $i_2$ through respectively the first and second diodes linearly dependent on the control signal M, the first current density being weighted in said sum by ratio of emitter areas $A_1$, $A_2$ of respectively the first and second transistors:

$$i_1 A_1/A_2 + i_2.$$

3. An integrated circuit according to claim 2, the emitter areas $A_1$, $A_2$ of the first and second transistors being substantially equal, characterized in that the first and second diodes have mutually different junction areas.

4. An integrated circuit according to claim 2 wherein the first and second current signals having a mutual difference which is linearly dependent on the control signal M, the control circuit comprising first and second current multiplying circuits, arranged for multiplying the first and second current signals with mutually unequal multiplication coefficients, and for supplying the multiplied first and second current signal to the first and second diodes respectively.

5. An integrated circuit according to claim 1, wherein
  the parallel circuit comprises a differential pair of a first and second transistor with their emitters coupled to each other, the admittance element being coupled in parallel to a collector emitter path of the first transistor,
  the control circuit comprises a first and second diode coupled together in mutually opposite polarity directions and coupled such that the currents flowing through the diodes are dependent on control signal M, and wherein a first end of the first diode is coupled to a base of the first transistor and a first end of the second diode is coupled to a base of the second transistor such that between respective bases of the first and second transistor, a voltage corresponding to a sum of voltages occurring in mutually opposite polarity directions across the first and second diodes respectively is supplied, and wherein the control circuit comprises at least a third and fourth diode coupled to the first and second diodes respectively, the sum of voltages being a sum of voltages in a first polarity direction occurring across the first and third diodes plus a sum of voltages in a second polarity direction opposite to said first polarity direction occurring across the second and fourth diodes.

6. An integrated circuit according to claim 2, in which a collector of the first and second transistors are respectively coupled to a first and second terminal, the integrated circuit comprising
  a further differential pair of a fifth and sixth transistor with their emitters coupled to each other, a collector of the fifth and sixth transistors respectively being coupled to the second and first terminal,
  a further admittance element coupled in parallel to a collector emitter path of the fifth transistor,
  the base connections of the first and fifth transistors being connected to each other and the base connections of the second and sixth transistors being connected to each other.

7. An integrated circuit according to claim 2, characterized in that the admittance element is coupled to the emitter of the first transistor via a current mirror, the admittance element being coupled to an input of the current mirror, an output of the current mirror being coupled to the emitter of the first transistor.

8. An electronic circuit comprising an integrated circuit including adjusting means for adjusting at least one electric parameter of the integrated circuit, the adjusting means being arranged for adjusting an effective admittance value of an effective admittance circuit comprising
  an admittance element,
  a parallel circuit, coupled in parallel to the admittance element, and arranged for conducting a parallel current $I_p$ in parallel with a current through the admittance element,
the adjusting means comprising
  a control circuit, having an output coupled to a control input of the parallel circuit and an input for receiving a control signal M for controlling the conducting of the parallel circuit, the parallel circuit is arranged for making the parallel current $I_p$ proportional to a reference current $I_{ref}$ through the admittance element: $I_p = \alpha\, I_{ref}$, with a proportionality coefficient $\alpha$, the control circuit being arranged for setting the coefficient $\alpha$ in a non-linear dependence on the control signal M, the dependence being a ratio $f_1/f_2$ of a first and second factor of which the second factor $f_2$ depends substantially polynomially on the control signal M and the first factor need not depend on the control signal M;
  the parallel circuit comprising a differential pair of a first and second transistor with their emitters coupled to each other and their collectors coupled to a first and second terminal respectively, the admittance element being coupled in parallel to a collector emitter path of the first transistor,
  the control circuit comprising a first diode and a second diode coupled together in mutually opposite polarity directions and wherein a first end of the first diode is coupled to a base of the first transistor and a first end of the second diode is coupled to a base of the second transistor such that between the respective bases of the first and second transistors, a voltage corresponding to a sum of voltages occurring in mutually opposite polarity directions across the first and second diodes respectively is supplied, wherein the control circuit includes current signal forming means coupled to the diodes for supplying first and second current signals which are dependent on control signal M to the diodes for making a sum of a first and second current density $i_1$, $i_2$ through respectively the first and second diodes linearly dependent on the control signal M, the first current density being weighted in said sum by ratio of emitter areas $A_1$, $A_2$ of respectively the first and second transistor: $i_1 A_1/A_2+i_2$;;

the electronic circuit further comprising an oscillator comprising a negative resistance circuit coupled to a tank circuit, the tank circuit comprising an inductor and the effective admittance, the admittance element being a capacitor, whereby an oscillating frequency of the oscillator circuit has a dependence on the control signal M, said dependence having a zero second-order derivative with respect to the control signal M for at least one point within an operative range of the control signal.

9. An electronic circuit according to claim 8, characterized, in that the inductor is a further admittance element in a further effective admittance, the tank circuit comprising the further effective admittance and further adjusting means, for adjusting an effective inductance of the further effective admittance under control of the control signal M, whereby the effective inductance and the effective admittance have a substantially identical dependence on the control signal M provided respectively by the further adjusting means and the adjusting means.

10. An integrated circuit according to claim 3 wherein the first and second current signals having a mutual difference which is linearly dependent on the control signal M, the control circuit comprising first and second current multiplying circuits, arranged for multiplying the first and second current signals with mutually unequal multiplication coefficients, and for supplying the multiplied first and second current signal to the first and second diodes respectively.

11. An integrated circuit according to claim 3 in which a collector of the first and second transistors are respectively coupled to a first and second terminal, the integrated circuit comprising a further differential pair of a fifth and sixth transistor with their emitters coupled to each other, a collector of the fifth and sixth transistors respectively being coupled to the second and first terminals, a further admittance element coupled in parallel to a collector emitter path of the fifth transistor, the base connections of the first and fifth transistors being connected to each other and the base connections of the second and sixth transistors being connected to each other.

12. An integrated circuit according to claim 4 in which a collector of the first and second transistors are respectively coupled to a first and second terminal, the integrated circuit comprising a further differential pair of a fifth and sixth transistor with their emitters coupled to each other, a collector of the fifth and sixth transistors respectively being coupled to the second and first terminals, a further admittance element coupled in parallel to a collector emitter path of the fifth transistor, the base connections of the first and fifth transistors being connected to each other and the base connections of the second and sixth transistors being connected to each other.

13. An integrated circuit according to claim 5 in which a collector of the first and second transistors are respectively coupled to a first and second terminal, the integrated circuit comprising a further differential pair of a fifth and sixth transistor with their emitters coupled to each other, a collector of the fifth and sixth transistors respectively being coupled to the second and first terminals, a further admittance element coupled in parallel to a collector emitter path of the fifth transistor, the base connections of the first and fifth transistors being connected to each other and the base connections of the second and sixth transistors being connected to each other.

14. An integrated circuit according to claim 3 characterized in that the admittance element is coupled to the emitter of the first transistor via a current mirror, the admittance element being coupled to an input of the current mirror, an output of the current mirror being coupled to the emitter of the first transistor.

15. An integrated circuit according to claim 4 characterized in that the admittance element is coupled to the emitter of the first transistor via a current mirror, the admittance element being coupled to an input of the current mirror, an output of the current mirror being coupled to the emitter of the first transistor.

16. An integrated circuit according to claim 5 characterized in that the admittance element is coupled to the emitter of the first transistor via a current mirror, the admittance element being coupled to an input of the current mirror, an output of the current mirror being coupled to the emitter of the first transistor.

* * * * *